United States Patent
Fukuda

(10) Patent No.: US 9,165,964 B2
(45) Date of Patent: Oct. 20, 2015

(54) IMAGE SENSOR AND IMAGE CAPTURE APPARATUS

(75) Inventor: Koichi Fukuda, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/817,387

(22) PCT Filed: Aug. 12, 2011

(86) PCT No.: PCT/JP2011/068725
§ 371 (c)(1),
(2), (4) Date: Feb. 15, 2013

(87) PCT Pub. No.: WO2012/032911
PCT Pub. Date: Mar. 15, 2012

(65) Prior Publication Data
US 2013/0140663 A1 Jun. 6, 2013

(30) Foreign Application Priority Data
Sep. 7, 2010 (JP) ................................. 2010-200291

(51) Int. Cl.
*H01L 27/146* (2006.01)
*G03B 13/36* (2006.01)
*H04N 5/225* (2006.01)

(52) U.S. Cl.
CPC .......... *H01L 27/14627* (2013.01); *G03B 13/36* (2013.01); *H01L 27/1461* (2013.01);
(Continued)

(58) Field of Classification Search
CPC ................. H01L 27/14603; H01L 27/14609; H01L 27/14623; H01L 27/14689; H01L 27/1463; H01L 27/14645; H01L 27/14656; H01L 27/14627
USPC .................................... 257/40, 225, 233, 291
See application file for complete search history.

(56) References Cited

U.S. PATENT DOCUMENTS 4,410,804 A  10/1983 Stauffer ......................... 250/578
6,026,964 A   2/2000 Hook et al. ................... 207/292
(Continued)

FOREIGN PATENT DOCUMENTS

CN  1839484 A   9/2006
EP  2180513 A1  4/2010
(Continued)

OTHER PUBLICATIONS

Sep. 16, 2014 extended European Search Report in corresponding to foreign counterpart application European Patent Application No. 11823390.7.
Dec. 17, 2014 Chinese Office Action corresponding to foreign counterpart Chinese Patent Application No. 201180043199.0.

*Primary Examiner* — Kyoung Lee
*Assistant Examiner* — Ratisha Mehta
(74) *Attorney, Agent, or Firm* — Fitzpatrick, Cella, Harper & Scinto

(57) ABSTRACT

An image sensor in which each pixel includes a first sub-pixel including a first semiconductor layer, a second sub-pixel including a second semiconductor layer having a polarity different from a polarity of the first semiconductor layer, a third semiconductor layer having a polarity equal to the polarity of the first semiconductor layer, and a microlens, and which includes a plurality of pixels in which the first semiconductor is included in the second semiconductor layer, and the second semiconductor layer is included in the third semiconductor layer, wherein a center of gravity position of a light-receiving surface defining the first semiconductor layer is different from a center of gravity position of a light-receiving surface defining both the first semiconductor layer and the second semiconductor layer.

10 Claims, 14 Drawing Sheets

(52) U.S. Cl.
CPC ...... *H01L27/1464* (2013.01); *H01L 27/14605* (2013.01); *H01L 27/14621* (2013.01); *H04N 5/2256* (2013.01); *H01L 27/1463* (2013.01); *H01L 27/14643* (2013.01)

(56) References Cited

U.S. PATENT DOCUMENTS

| | | | |
|---|---|---|---|
| 6,781,632 | B1 | 8/2004 | Ide |
| 6,829,008 | B1 | 12/2004 | Saga et al. .................... 348/302 |
| 7,601,992 | B2 | 10/2009 | Hashimoto et al. |
| 8,134,690 | B2 | 3/2012 | Tachino et al. ............ 356/4.01 |
| 2002/0125513 | A1* | 9/2002 | Inoue ........................... 257/291 |
| 2008/0272414 | A1* | 11/2008 | Vora ............................. 257/291 |

FOREIGN PATENT DOCUMENTS

| | | |
|---|---|---|
| JP | 11-121732 A | 4/1999 |
| JP | 2000-156823 A | 6/2000 |
| JP | 2005-175232 A | 6/2005 |
| JP | 2005-303268 A | 10/2005 |
| JP | 2008-15215 A | 1/2008 |
| JP | 2008-028105 A | 2/2008 |
| JP | 2008-147486 A | 6/2008 |
| JP | 2010-267720 A | 11/2010 |
| WO | 2010/055931 A1 | 5/2010 |

* cited by examiner

F I G. 2
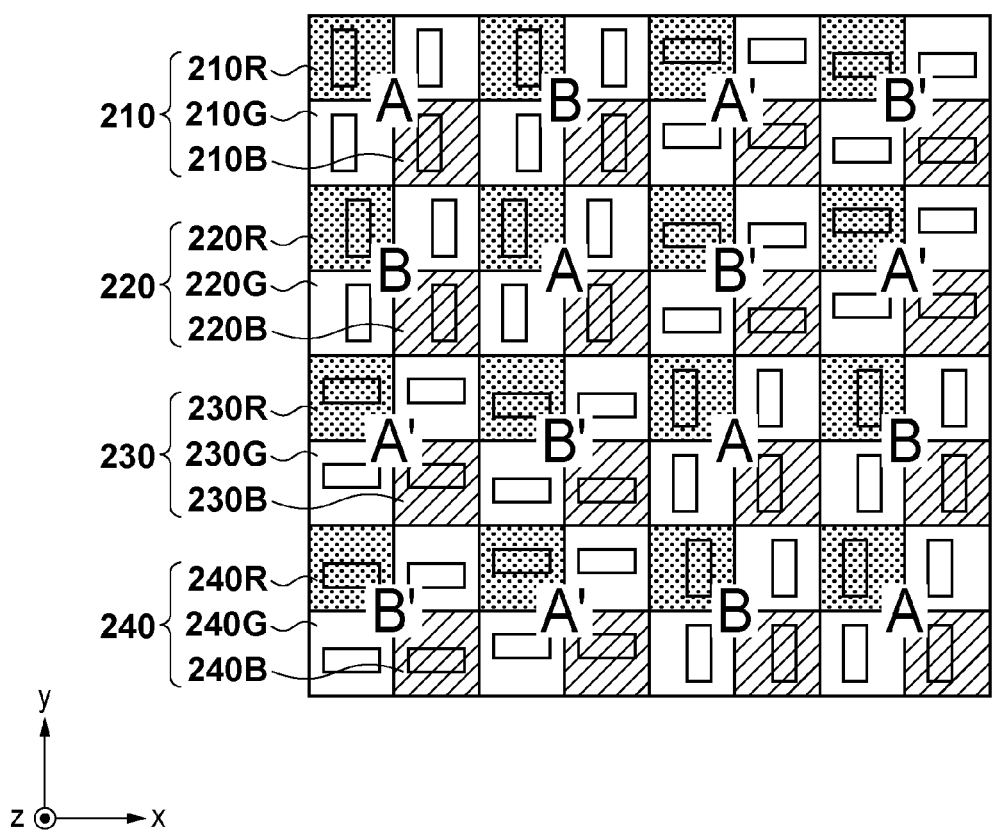

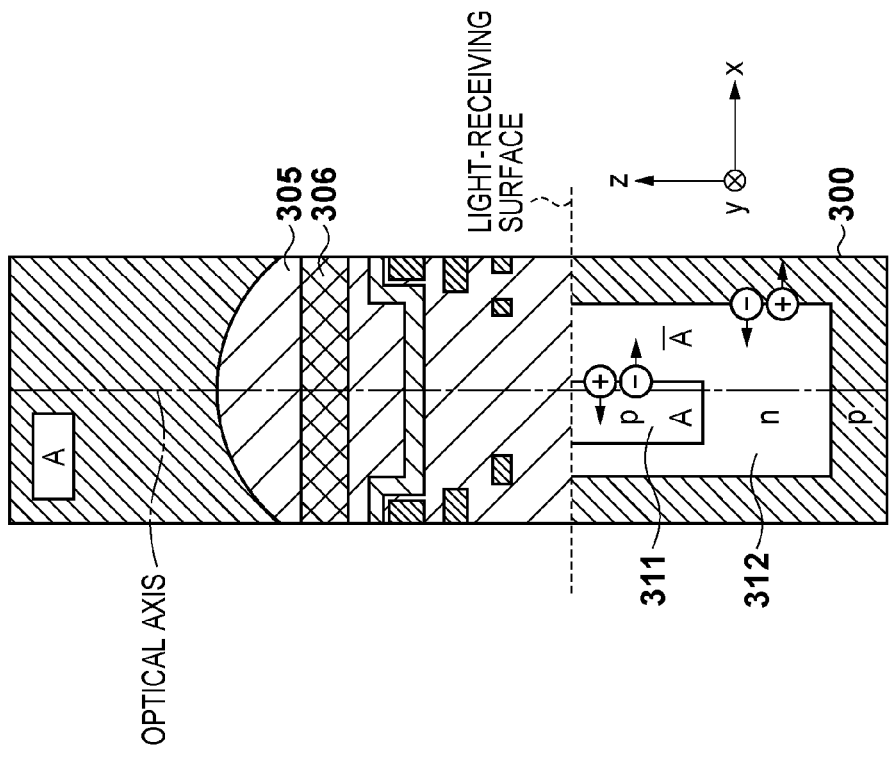
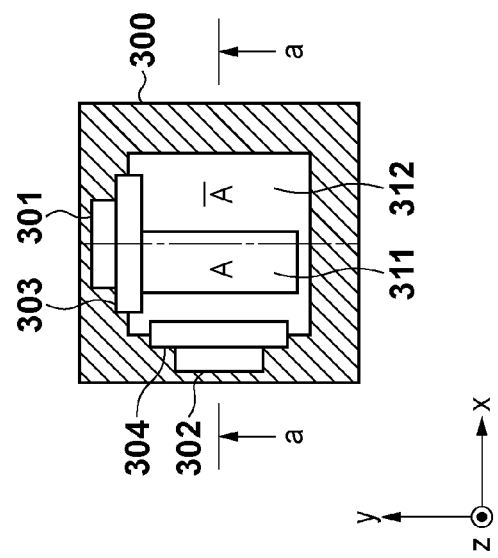
FIG. 3A
FIG. 3B

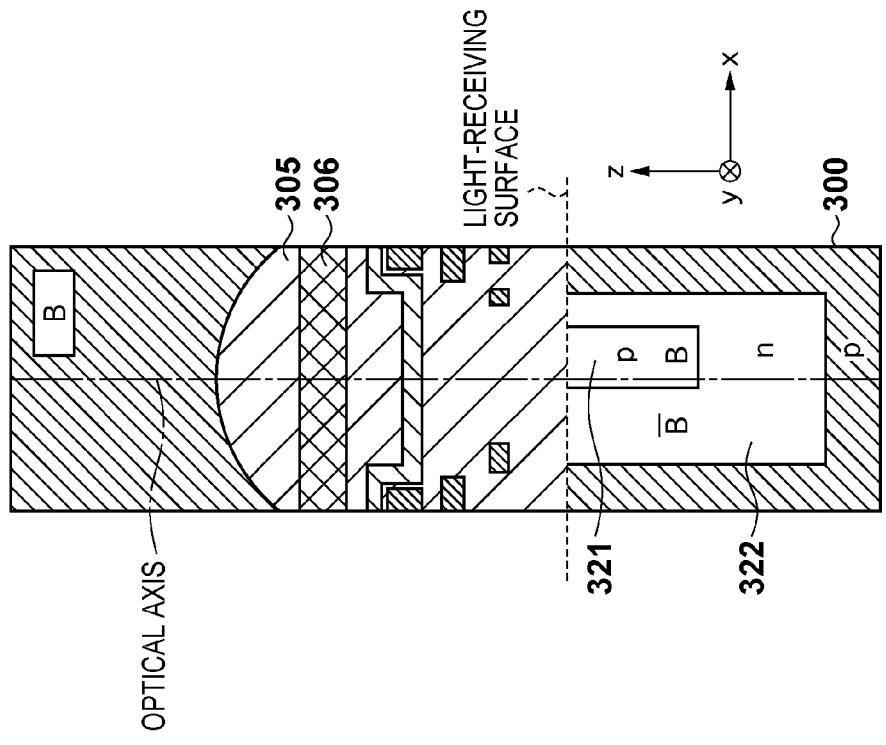
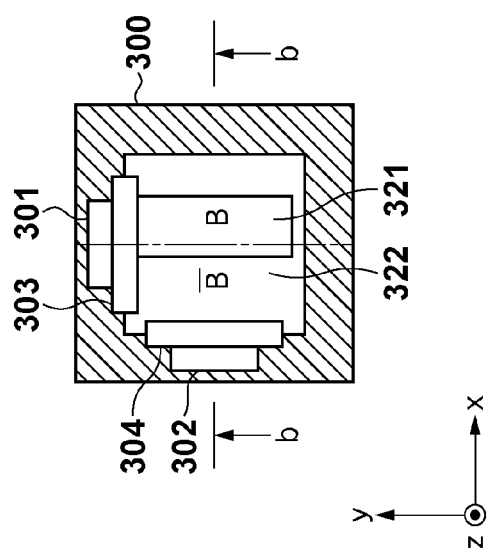
FIG. 4A
FIG. 4B

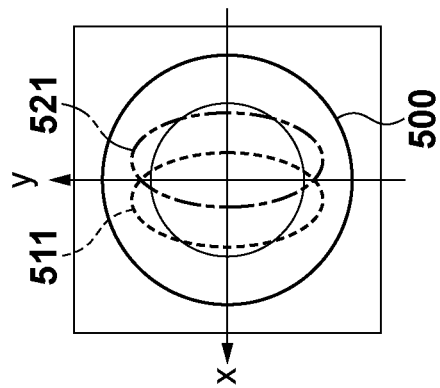
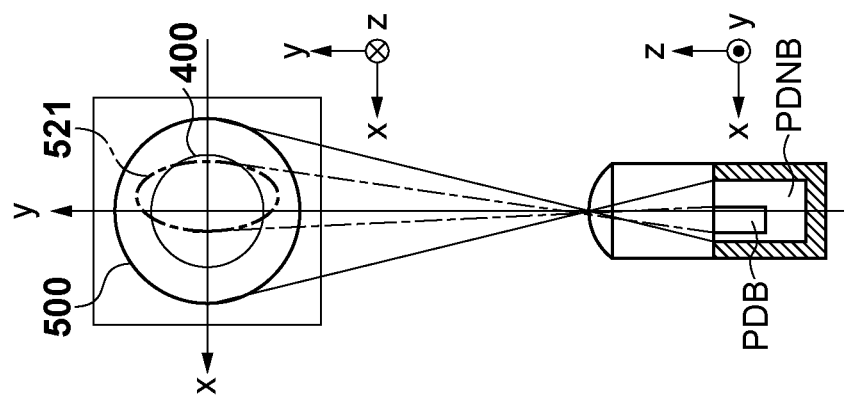
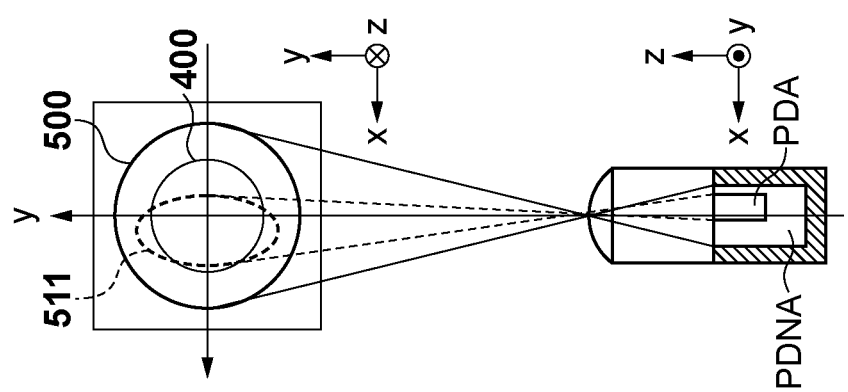

IMAGE SENSOR AND IMAGE CAPTURE APPARATUS

TECHNICAL FIELD

The present invention relates to an image sensor having a focus detection function, and an image capture apparatus using the same.

BACKGROUND ART

U.S. Pat. No. 4,410,804 discloses an image capture apparatus that performs focus detection of the pupil division scheme using a two-dimensional sensor including a microlens formed in each pixel. In the image capture apparatus described in U.S. Pat. No. 4,410,804, one microlens and a plurality of divided photo-electric conversion units are formed in one pixel. The divided photo-electric conversion units receive light beams in different areas of the pupil of an imaging lens via one microlens, thereby performing pupil division. The amount of image shift is obtained from a signal received by each of the divided photo-electric conversion units, focus detection is performed, and the signals received by the divided photo-electric conversion units are summed up, thereby acquiring an image capture signal. In addition to focus detection, this patent literature discloses a technique of displaying parallax signals, which are received by photo-electric conversion units divided to the right and left in each pixel, separately for the right and left eyes, respectively, thereby making it possible to generate a stereoscopic image.

Japanese Patent Laid-Open No. 2000-156823 discloses an image capture apparatus in which a plurality of image capture pixels are not only arranged but also where focus detection pixels of the pupil division scheme are partly arranged. In Japanese Patent Laid-Open No. 2000-156823, image capture signals are acquired by the image capture pixels arranged in most areas, and focus detection is performed using signals from the focus detection pixels arranged in some areas. The focus detection pixels receive light beams in predetermined areas of the pupil of an imaging lens via a light-shielding layer having an opening, thereby performing pupil division.

Japanese Patent Laid-Open No. 2008-15215 proposes an image capture apparatus which uses focus detection pixels each formed by partly forming a pair of divided photo-electric conversion units so as to surround the lower portion of a photo-electric conversion unit of an image capture pixel sideways in an L shape. Charges stored in the image capture pixel and the pair of focus detection pixels have an equal polarity, and are connected to the same floating diffusion portion. This patent literature also discloses that no color filter is formed in a portion in which a focus detection pixel is formed, so the upper, image capture pixels mainly receive short-wavelength components of incident light, and the lower, focus detection pixels mainly receive long-wavelength components of the incident light, thereby performing focus detection.

In the image capture apparatus disclosed in U.S. Pat. No. 4,410,804, signals received by the plurality of divided photo-electric conversion units are summed up to obtain an image capture signal. However, the gaps between the divided photo-electric conversion units do not have light reception sensitivity, and therefore become low-sensitivity zones. Hence, the light reception efficiency considerably degrades for light which has a specific incident angle and is focused at the position between photo-electric conversion units by the microlens. As a result, unnatural dark patterns, for example, vertical, horizontal, or cross-shaped patterns are generated in a blurred image, thus deteriorating the quality of a captured image.

In the image capture apparatus disclosed in Japanese Patent Laid-Open No. 2000-156823, signals received by the focus detection pixels arranged in some part cannot be used as image capture signals, so the focus detection pixels become pixels unavailable as image capture pixels. Although the quality of a captured image can be restored by unavailable pixel correction, interpolation processing which uses peripheral pixels must be performed, thus partially degrading the resolution of the captured image.

In the image capture apparatus disclosed in Japanese Patent Laid-Open No. 2008-15215, photo-electric conversion units formed in the upper portion of an Si (silicon) layer receive short-wavelength components of incident light to obtain image capture signals, and photo-electric conversion units formed by division in its lower portion receive long-wavelength components of the incident light to obtain focus detection signals.

However, because the wavelength of incident light is divided using a difference in spectral absorbance that depends on the thickness of the Si layer, color separation cannot perfectly be done. FIG. 18 shows the spectral absorbance when the thickness of the Si layer is 400 nm using a broken line, that when the thickness of the Si layer is 1,500 nm using a solid line, and that when the thickness of the Si layer is 3,500 nm using an alternate long and short dashed line. When, for example, the depth of the photo-electric conversion units is about 400 nm, about 75 percent of light having wavelengths of 450 to 470 nm corresponding to B (Blue), about 35 percent of light having wavelengths of 520 to 540 nm corresponding to G (Green), and about 15 percent of light having wavelengths of 620 to 640 nm corresponding to R (Red) are received, as indicated by the broken line in FIG. 18. Thus, the blue, green, and red components mix with each other at a ratio of 6:3:1.

Similarly, when focus detection pixels are provided in the upper portion of the Si layer, and image capture pixels are provided in its lower portion, the color purity of image capture signals from the image capture pixels degrades. When, for example, the depth of the photo-electric conversion units is about 3,500 nm, about 20 percent of light having wavelengths of 520 to 540 nm corresponding to G (Green), and about 30 percent of light having wavelengths of 620 to 640 nm corresponding to R (Red) are received, as can be seen from the difference between the spectral absorbances indicated by the alternate long and short dashed line and solid line, respectively, in FIG. 18. Thus, the green and red components mix with each other at a ratio of 4:6.

Therefore, in the image capture apparatus disclosed in Japanese Patent Laid-Open No. 2008-15215, the color purity of the image capture signals partially degrade, thus deteriorating the quality of a captured image.

Also, because color separation is done using a difference in spectral absorbance that depends on the thickness of the Si layer, the depth of the photo-electric conversion units cannot freely be adjusted. This narrows the dynamic range. Furthermore, to form a pair of photo-electric conversion units so as to surround another photo-electric conversion unit sideways in an L shape, the manufacturing process becomes complicated.

Therefore, in all of these prior art techniques, the quality of a captured image deteriorates upon adding a focus detection function of the phase difference scheme to an image sensor.

SUMMARY OF INVENTION

The present invention has been made in consideration of the above-mentioned situation, and provides an image sensor which attains both a high-quality image and a focus detection function of the phase difference scheme.

According to the first aspect of the present invention, there is provided an image sensor in which each pixel includes a first sub-pixel including a first semiconductor layer, a second sub-pixel including a second semiconductor layer having a polarity different from a polarity of the first semiconductor layer, a third semiconductor layer having a polarity equal to the polarity of the first semiconductor layer, and a microlens, and which includes a plurality of pixels in which the first semiconductor is included in the second semiconductor layer, and the second semiconductor layer is included in the third semiconductor layer, wherein a center of gravity position of a light-receiving surface defining the first semiconductor layer is different from a center of gravity position of a light-receiving surface defining both the first semiconductor layer and the second semiconductor layer.

According to the second aspect of the present invention, there is provided an image sensor in which each pixel includes a first sub-pixel including a first semiconductor layer, a second sub-pixel including a second semiconductor layer having a polarity different from a polarity of the first semiconductor layer, a third semiconductor layer having a polarity equal to the polarity of the first semiconductor layer, and a microlens, and which includes a plurality of pixels in which the first semiconductor is included in the second semiconductor layer, and the second semiconductor layer is included in the third semiconductor layer, wherein the first semiconductor layer is divided into a plurality of partial semiconductor layers, and a center of gravity position of a light-receiving surface defining at least one of the partial semiconductor layers is different from a center of gravity position of a light-receiving surface defining both the first semiconductor layer and the second semiconductor layer.

According to the third aspect of the present invention, there is provided an image capture apparatus comprising an image sensor defined above.

Further features of the present invention will become apparent from the following description of exemplary embodiments with reference to the attached drawings.

BRIEF DESCRIPTION OF DRAWINGS

FIG. 2 is a schematic view of a pixel array in the first embodiment of the present invention;

FIGS. 3A and 3B are a schematic plan view and schematic sectional view, respectively, of pixel A in the first embodiment of the present invention;

FIGS. 4A and 4B are a schematic plan view and schematic sectional view, respectively, of pixel B in the first embodiment of the present invention;

FIGS. 5A to 5C are schematic explanatory views of pupil division in the first embodiment of the present invention;

DESCRIPTION OF EMBODIMENTS

First Embodiment

Figure 1:
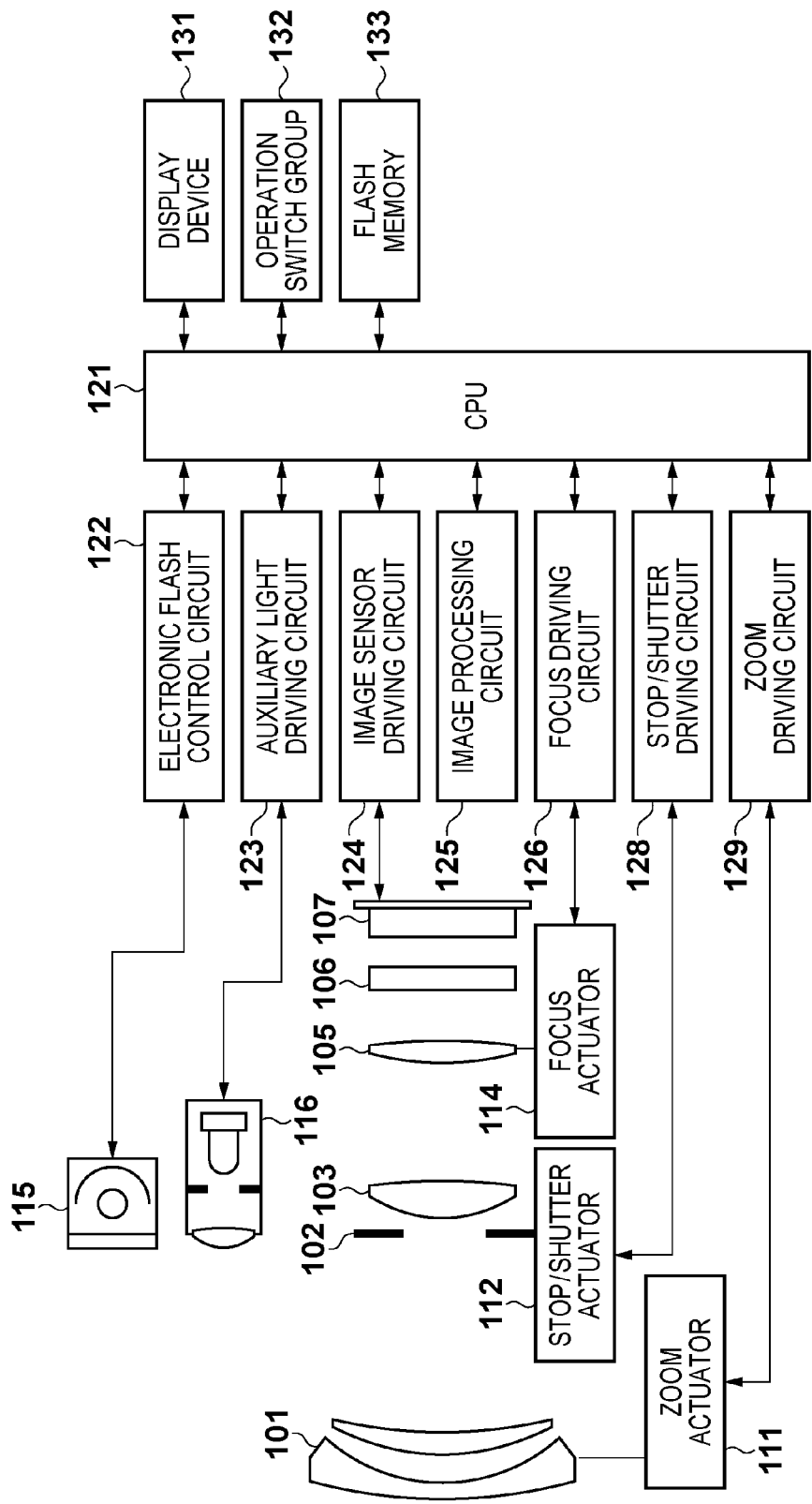
FIG. 1 is a block diagram showing the schematic configuration of an image capture apparatus in the first embodiment of the present invention.

The first embodiment of the present invention will be described below with reference to FIGS. 1 to 10. FIG. 1 is a block diagram showing the configuration of a camera serving as an image capture apparatus including an image sensor in the first embodiment of the present invention. Referring to FIG. 1, reference numeral 101 denotes a first lens group which is positioned at the distal end of an imaging optical system. The first lens group 101 is held to be extendable/retractable in the optical axis direction. Reference numeral 102 denotes a stop & shutter which not only adjusts the amount of light in image capture by adjusting its aperture diameter, but also functions as an exposure time adjusting shutter in still image capture. Reference numeral 103 denotes a second lens group. The stop & shutter 102 and second lens group 103 extend and retract in the optical axis direction together, and interlock with the extension and retraction operations of the first lens group 101 to provide a scaling function (zoom function). Reference numeral 105 denotes a third lens group which extends and retracts in the optical axis direction to perform focus adjustment. Reference numeral 106 denotes an optical lowpass filter which serves as an optical element for reducing the false color and moiré of a captured image. Reference numeral 107 denotes an image sensor which includes a two-dimensional CMOS photosensor and its peripheral circuit.

Reference numeral 111 denotes a zoom actuator which pivots a cam cylinder (not shown) to extend and retract the first lens group 101 to third lens group 105 in the optical axis direction, thereby performing a scaling operation. Reference numeral 112 denotes a stop/shutter actuator which controls the aperture diameter of the stop & shutter 102 to adjust the amount of image capture light, and controls the exposure time in still image capture. Reference numeral 114 denotes a focus actuator which extends and retracts the third lens group 105 in the optical axis direction to perform focus adjustment.

Reference numeral 115 denotes an electronic flash which is used for object illumination in image capture. The electronic flash 115 preferably uses a flash illumination device which employs a xenon tube but may use an illumination device including an LED which continuously emits light. Reference numeral 116 denotes an AF auxiliary light device which projects an image of a mask having a predetermined opening pattern onto the field via a light projection lens to improve the focus detection capability for a dark object or a low-contrast object.

Reference numeral 121 denotes a camera CPU which performs various types of control of the camera body. The camera CPU 121 includes, for example, an arithmetic unit, ROM, RAM, A/D converter, D/A converter, and communication interface circuit, and drives various circuits provided in the camera, based on a predetermined program stored in the ROM. The camera CPU 121 then executes a series of operations including, for example, AF, image capture, image processing, and recording.

Reference numeral 122 denotes an electronic flash control circuit which ON/OFF-controls the electronic flash 115 in synchronism with an image capture operation. Reference numeral 123 denotes an auxiliary light driving circuit which ON/OFF-controls the AF auxiliary light device 116 in synchronism with a focus detection operation. Reference numeral 124 denotes an image sensor driving circuit which controls the image sensing operation of the image sensor 107, A/D-converts an acquired image signal, and sends it to the camera CPU 121. Reference numeral 125 denotes an image processing circuit which performs various types of processing such as gamma conversion, color interpolation, and JPEG compression of an image acquired by the image sensor 107.

Reference numeral 126 denotes a focus driving circuit which controls driving of the focus actuator 114 based on the focus detection result, and extends and retracts the third lens group 105 in the optical axis direction to perform focus adjustment. Reference numeral 128 denotes a stop/shutter driving circuit which controls driving of the stop/shutter actuator 112 to control the aperture of the stop & shutter 102. Reference numeral 129 denotes a zoom driving circuit which drives the zoom actuator 111 in accordance with the zoom operation of the photographer.

Reference numeral 131 denotes a display device such as an LCD. The display device 131 displays, for example, information associated with the image capture mode of the camera, a preview image before image capture, a confirmation image after image capture, and a focus state display image upon focus detection. Reference numeral 132 denotes an operation switch group which includes, for example, a power supply switch, release (image capture trigger) switch, zoom operation switch, and image capture mode selection switch. Reference numeral 133 denotes a detachable flash memory which records a captured image.

[Focus Detection Sub-Pixels and Image Capture Sub-Pixels]

FIG. 2 is a schematic view of a pixel array of the image sensor in the first embodiment. FIG. 2 shows a pixel array of a two-dimensional CMOS sensor (image sensor) in this embodiment in the range of 8 (columns)×8 (rows) pixels. A large number of sets of 8 (columns)×8 (rows) pixels shown in FIG. 2 are arranged on the surface of the image sensor, thereby making it possible to acquire a high-resolution image. This embodiment assumes an image sensor having a pixel pitch of 4 μm, 5,575 (columns)×3,725 (rows)=about 20 million effective pixels, and an image capture screen size of 22.3 mm (horizontal)×14.9 mm (vertical).

In the first embodiment, a pixel A group 210 including 2 (rows)×2 (columns) pixels A shown in FIG. 2 adopts a Bayer arrangement in which pixels A 210G having the spectral sensitivity of G are arranged as two diagonal pixels, and a pixel A 210R having the spectral sensitivity of R and a pixel A 210B having the spectral sensitivity of B are arranged as the remaining two pixels. Moreover, as will be described later, each of the pixels A 210R, 210G, and 210B includes a focus detection sub-pixel (first sub-pixel) and image capture sub-pixel (second sub-pixel), and the center of gravity of the light-receiving surface of the focus detection sub-pixel shifts in the −x direction with respect to that of the light-receiving surface of the image capture sub-pixel. On the other hand, in pixels B 220R, 220G, and 220B which form a pixel B group 220, the center of gravity of the light-receiving surface of the focus detection sub-pixel shifts in the +x direction with respect to that of the light-receiving surface of the image capture sub-pixel.

Similarly, in pixels A' 230R, 230G, and 230B which form a pixel A' group 230, the center of gravity of the light-receiving surface of the focus detection sub-pixel shifts in the +y direction with respect to that of the light-receiving surface of the image capture sub-pixel. Also, in pixels B' 240R, 240G, and 240B which form a pixel B' group 240, the center of gravity of the light-receiving surface of the focus detection sub-pixel shifts in the −y direction with respect to that of the light-receiving surface of the image capture sub-pixel.

FIG. 3A is a plan view of one pixel A 210G of the image sensor, shown in FIG. 2, when viewed from the side of the light-receiving surface of the image sensor (+z side), and FIG. 3B is a sectional view taken along a cross-section a-a when viewed from the −y side. Also, FIG. 4A is a plan view of one pixel B 220G of the image sensor, shown in FIG. 2, when viewed from the side of the light-receiving surface of the image sensor (+z side), and FIG. 4B is a sectional view taken along a cross-section b-b when viewed from the −y side.

In the pixel A 210G in this embodiment, an n-type layer (second semiconductor layer) 312 is formed to be included in a p-type well (third semiconductor layer) 300, and a p-type layer (first semiconductor layer) 311 is formed to be included in the n-type layer (second semiconductor layer) 312 with a shift to the −x side, as shown in FIGS. 3A and 3B. More specifically, the center of gravity of the light-receiving surface defining the p-type layer (first semiconductor layer) 311 shifts with respect to that of the light-receiving surface defining both the p-type layer (first semiconductor layer) 311 and n-type layer (second semiconductor layer) 312. Note that the first semiconductor layer and the second semiconductor layer have different polarities, and the first semiconductor layer and the third semiconductor layer have an equal polarity.

With this structure, the p-type layer (first semiconductor layer) 311 and n-type layer (second semiconductor layer) 312 are connected to each other, thereby forming a pn junction photodiode (first photo-electric conversion unit) PDA with a shift to the −x side. Similarly, the n-type layer (second semiconductor layer) 312 and p-type well (third semiconductor layer) 300 are connected to each other, thereby forming a pn junction photodiode (second photo-electric conversion unit) PDNA.

A microlens 305 for focusing incident light is formed on the light-receiving side of each pixel. Also, a color filter 306 for selecting light reception wavelengths to perform color separation is formed on the side of the microlens 305 (microlens side) with respect to both the p-type layer (first semiconductor layer) 311 serving as the p-type anode of the photodiode PDA and the n-type layer (second semiconductor layer) 312 serving as the n-type cathode of both the photodiodes PDA and PDNA. The pixel A 210G includes a G (Green) color filter formed on it. The pixel A 210R includes an R (Red) color filter formed on it, and the pixel A 210B includes a B (Blue) color filter formed on it.

A color filter of another color may be formed as needed. In, for example, an array of R (Red), G (Green), B (Blue), and W (White) pixels, the white pixels may use transparent filters (ultraviolet/infrared cut filters). Also, the color filter 306 may use an absorption filter which absorbs wavelengths other than selected wavelengths, or a reflection filter which reflects wavelengths other than selected wavelengths, such as an interference filter.

Light incident on each pixel is focused by the microlens 305, undergoes color separation by the color filter 306, and is then received by the photodiodes PDA and PDNA. A light component received by the photodiode PDA is photo-electrically converted to generate holes and electrons. The positively charged holes are accumulated in the p-type layer (first semiconductor layer) 311, while the negatively charged electrons are accumulated in the n-type layer (second semiconductor layer) 312. Also, a light component received by the photodiode PDNA is photo-electrically converted to generate holes and electrons. The electrons are accumulated in the n-type layer (second semiconductor layer) 312. On the other hand, the holes are discharged outside the image sensor via the p-type well (third semiconductor layer) 300 connected to a constant voltage source (not shown).

The pixel A 210G in this embodiment includes a first sub-pixel and second sub-pixel. The first sub-pixel is formed from a $p^+$ floating diffusion ($p^+$ FD) area 301 connected to the p-type layer (first semiconductor layer) 311 via a transfer gate 303. The $p^+$ FD area 301 and transfer gate 303 may be omitted as needed.

The second sub-pixel is formed from an $n^+$ floating diffusion ($n^+$ FD) area 302 connected to the n-type layer (second semiconductor layer) 312 via a transfer gate 304. The $n^+$ FD area 302 and transfer gate 304 may be omitted as needed.

On the other hand, in the pixel B 220G in this embodiment, an n-type layer (second semiconductor layer) 322 is formed to be included in a p-type well (third semiconductor layer) 300, and a p-type layer (first semiconductor layer) 321 is formed to be included in the n-type layer (second semiconductor layer) 322 with a shift to the +x side, as shown in FIGS. 4A and 4B. More specifically, the center of gravity of the light-receiving surface defining the p-type layer (first semiconductor layer) 321 shifts in the direction opposite to the pixel A 210G with respect to that of the light-receiving surface defining both the p-type layer (first semiconductor layer) 321 and n-type layer (second semiconductor layer) 322. Note that the first semiconductor layer and the second semiconductor layer have different polarities, and the first semiconductor layer and the third semiconductor layer have an equal polarity.

With this structure, the p-type layer (first semiconductor layer) 321 and n-type layer (second semiconductor layer) 322 are connected to each other, thereby forming a pn junction photodiode (first photo-electric conversion unit) PDB with a shift to the +x side. Similarly, the n-type layer (second semiconductor layer) 322 and p-type well (third semiconductor layer) 300 are connected to each other, thereby forming a pn junction photodiode (second photo-electric conversion unit) PDNB. Other features are the same between the pixel A 210G and the pixel B 220G.

With this arrangement, a focus detection signal can be obtained from the first sub-pixel, and an image capture signal can simultaneously be obtained from the second sub-pixel at the same pixel position. This makes it possible to arrange focus detection pixels without generating pixels unavailable as image capture pixels, thus attaining both a high-quality image and a focus detection function of the phase difference scheme.

The effect of the present invention will be explained below. FIGS. 5A to 5C are schematic explanatory views showing the correspondence between pupil division and the photo-electric conversion units of each pixel. FIG. 5A shows a sectional view taken along a cross-section a-a in the pixel A 210G, shown in FIG. 3A, when viewed from the +y side, and the exit pupil plane of the imaging optical system. Also, FIG. 5B shows a sectional view taken along a cross-section b-b of the pixel B 220G, shown in FIG. 4A, when viewed from the +y side, and the exit pupil plane of the imaging optical system. Note that referring to FIGS. 5A to 5C, the x- and y-axes of the sectional views are inverted to those in FIGS. 3A, 3B, 4A, and 4B to match them with the coordinate axes defined in the exit pupil plane.

Referring to FIG. 5A, reference symbol PDA denotes a first photo-electric conversion unit of pixel A; and PDNA, a second photo-electric conversion unit of pixel A. Also, referring to FIG. 5B, reference symbol PDB denotes a first photo-electric conversion unit of pixel B; and PDNB, a second photo-electric conversion unit of pixel B.

The first photo-electric conversion unit PDA of pixel A is an area which extends to a depletion layer, formed in the junction portion between the p-type layer (first semiconductor layer) 311 and the n-type layer (second semiconductor layer) 312 shown in FIGS. 3A and 3B, and its vicinity by the distance by which minority carriers have diffused. This area nearly overlaps the area of the p-type layer (first semiconductor layer) 311. Also, the second photo-electric conversion unit PDNA of pixel A is an area which extends to a depletion layer, formed in the junction portion between the n-type layer (second semiconductor layer) 312 and the p-type well (third semiconductor layer) 300, and its vicinity by the distance by which minority carriers have diffused. This area nearly overlaps the area of the n-type layer (second semiconductor layer) 312.

As shown in FIG. 5A, because the p-type layer (first semiconductor layer) 311 shown in FIGS. 3A and 3B is included in the n-type layer (second semiconductor layer) 312, the first photo-electric conversion unit PDA is included in the second photo-electric conversion unit PDNA. Also, because the p-type layer (first semiconductor layer) 311 shifts to the −x side with respect to the n-type layer (second semiconductor layer) 312, the first photo-electric conversion unit PDA shifts to the −x side with respect to the second photo-electric conversion unit PDNA.

Similarly, as shown in FIG. 5B, in pixel B as well, because the p-type layer (first semiconductor layer) 321 shown in FIGS. 4A and 4B is included in the n-type layer (second semiconductor layer) 322, the first photo-electric conversion unit PDB is included in the second photo-electric conversion unit PDNB. On the other hand, in pixel B, because the p-type layer (first semiconductor layer) 321 shifts to the +x side with respect to the n-type layer (second semiconductor layer) 322, the first photo-electric conversion unit PDB shifts to the +x side with respect to the second photo-electric conversion unit PDNB.

A photo-electric conversion unit PD which integrates the first photo-electric conversion unit PDA and second photo-electric conversion unit PDNA of pixel A, and a photo-electric conversion unit PD' which integrates the first photo-electric conversion unit PDB and second photo-electric conversion unit PDNB of pixel B are formed to be nearly identical to each other.

The p-type layer (first semiconductor layer) 311 which forms the first sub-pixel of pixel A serves as the p-type anode of the first photo-electric conversion unit PDA, and accumulates holes generated in accordance with the amount of light received by the first photo-electric conversion unit PDA, as shown in FIGS. 3A and 3B. The accumulated holes are transferred to the $p^+$ floating diffusion area 301 under the control of the transfer gate 303, and converted into voltage signals.

In contrast to this, the n-type layer (second semiconductor layer) 312 which forms the second sub-pixel of pixel A serves as the n-type cathode of both the first photo-electric conversion unit PDA and second photo-electric conversion unit PDNA. Thus, the n-type layer (second semiconductor layer) 312 accumulates electrons that are the sum of electrons generated in accordance with the amount of light received by the first photo-electric conversion unit PDA and those generated in accordance with the amount of light received by the second photo-electric conversion unit PDNA. The accumulated electrons are transferred to the $n^+$ floating diffusion area 302 under the control of the transfer gate 304, and converted into voltage signals.

Therefore, the first sub-pixel of pixel A outputs a signal corresponding to the amount of light received by only the first photo-electric conversion unit PDA. On the other hand, the second sub-pixel of pixel A outputs a signal corresponding to the amount of light received by the photo-electric conversion unit PD which integrates the first photo-electric conversion unit PDA and second photo-electric conversion unit PDNA.

Similarly, the first sub-pixel of pixel B outputs a signal corresponding to the amount of light received by only the first photo-electric conversion unit PDB. On the other hand, the second sub-pixel of pixel B outputs a signal corresponding to the amount of light received by the photo-electric conversion unit PD' which integrates the first photo-electric conversion unit PDB and second photo-electric conversion unit PDNB.

Referring to FIGS. 5A and 5B, reference numeral 400 denotes the exit pupil of the imaging optical system; 500, the pupil light-receiving area of the second sub-pixels of pixels A and B; 511, the pupil light-receiving area of the first sub-pixel of pixel A; and 521, the pupil light-receiving area of the first sub-pixel of pixel B. A light beam from an object enters each pixel upon passing through the exit pupil 400 of the imaging optical system.

In this embodiment, image capture signals can be obtained from the second sub-pixels. The pupil light-receiving area 500 of the second sub-pixel of pixel A (pixel B) is nearly conjugate to the light-receiving surface defining the photo-electric conversion unit PD (photo-electric conversion unit PD') of the second sub-pixel of pixel A by means of the microlens, and serves as a pupil area in which the second sub-pixel of pixel A (pixel B) can receive light. While the pupil distance is several ten millimeters, the diameter of the microlens is several micrometers. Thus, the F-number of the microlens is several ten thousands, so diffraction blur on the order of several ten millimeters occurs. Naturally, an image on the light-receiving surface defining the photo-electric conversion unit PD (photo-electric conversion unit PD') becomes a light reception ratio distribution instead of becoming a sharply defined area.

To allow the second sub-pixels to serve as image capture pixels, the pupil light-receiving area 500 of the second sub-pixels is set as large as possible to be able to receive a larger amount of light beam having passed through the exit pupil 400, and its center of gravity is set to nearly coincide with the optical axis.

Figure 6:
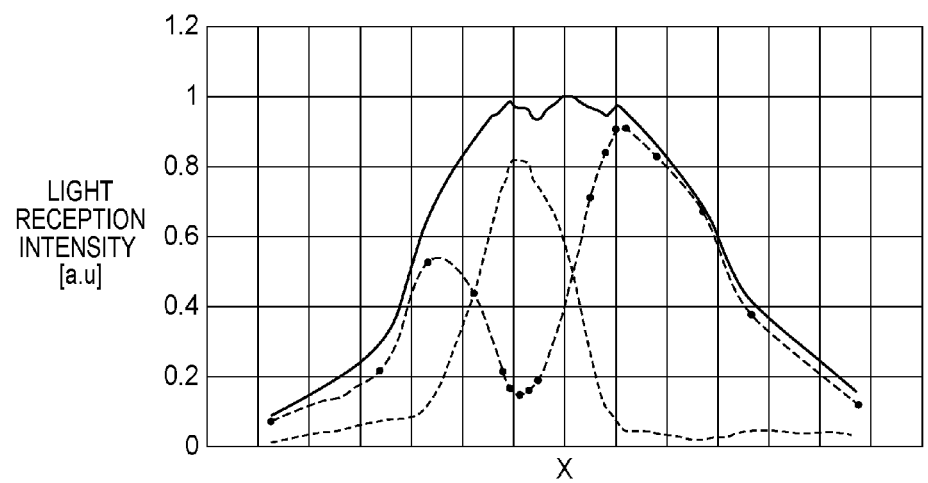
FIG. 6 is a graph showing the pupil intensity distribution of pixel A in the first embodiment of the present invention.

In this embodiment, the first sub-pixels serve as focus detection sub-pixels. The pupil light-receiving area 511 of the first sub-pixel of pixel A is nearly conjugate to the light-receiving surface defining the first photo-electric conversion unit PDA of the first sub-pixel of pixel A by means of the microlens, and serves as a pupil area in which the first sub-pixel of pixel A can receive light. The pupil light-receiving area 511 of the first sub-pixel of pixel A is smaller than the pupil light-receiving area 500 of the second sub-pixel of pixel A, so its center of gravity shifts to the +x side on the pupil plane. FIG. 6 is a graph illustrating an example of the pupil intensity distribution of pixel A on the pupil plane along the x-axis. Referring to FIG. 6, a broken line indicates the pupil intensity distribution of the pupil light-receiving area 511 of the first sub-pixel of pixel A, and a solid line indicates the pupil intensity distribution of the pupil light-receiving area 500 of the second sub-pixel of pixel A.

Figure 7:
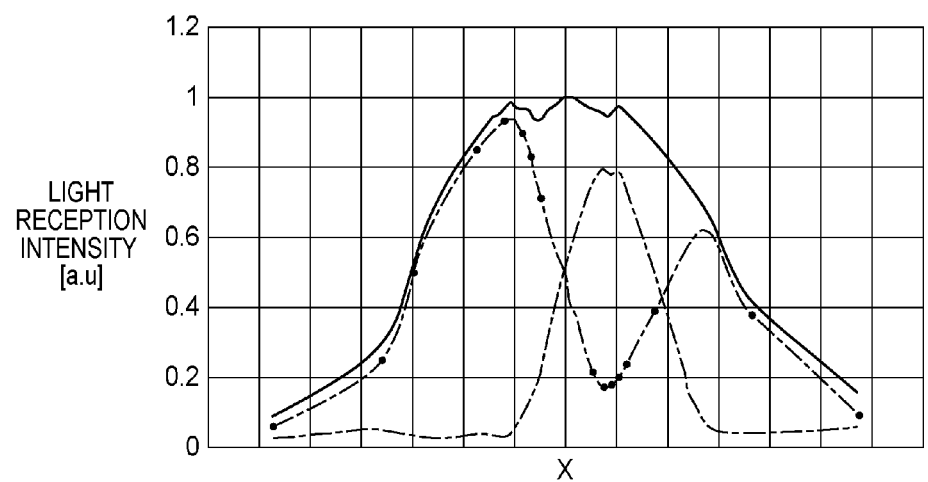
FIG. 7 is a graph showing the pupil intensity distribution of pixel B in the first embodiment of the present invention.

On the other hand, the pupil light-receiving area 521 of the first sub-pixel of pixel B is nearly conjugate to the light-receiving surface defining the first photo-electric conversion unit PDB of the first sub-pixel of pixel B by means of the microlens, and serves as a pupil area in which the first sub-pixel of pixel B can receive light. The pupil light-receiving area 521 of the first sub-pixel of pixel B is smaller than the pupil light-receiving area 500 of the second sub-pixel of pixel B, so its center of gravity shifts to the −x side on the pupil plane. FIG. 7 is a graph illustrating an example of the pupil intensity distribution of pixel B on the pupil plane along the x-axis. Referring to FIG. 7, an alternate long and short dashed line indicates the pupil intensity distribution of the pupil light-receiving area 521 of the first sub-pixel of pixel B, and a solid line indicates the pupil intensity distribution of the pupil light-receiving area 500 of the second sub-pixel of pixel B.

Figure 8:
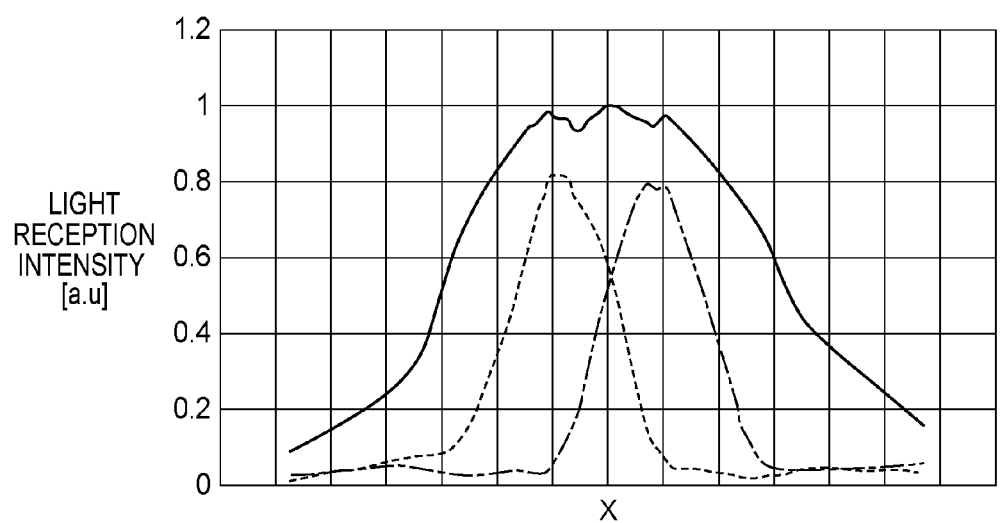
FIG. 8 is a graph showing the pupil intensity distributions of pixels A and B in the first embodiment of the present invention.

FIGS. 5C and 8 show the pupil intensity distribution of the first sub-pixel of pixel A, that of the first sub-pixel of pixel B, and that of the second sub-pixel of pixel A (and pixel B). Each of the pupil intensity distribution of the first sub-pixel of pixel A and that of the first sub-pixel of pixel B divides the exit pupil in the x direction. Similarly, each of the pupil intensity distribution of the first sub-pixel of pixel A' and that of the first sub-pixel of pixel B' shown in FIG. 2 divides the exit pupil in the y direction.

The pixels A 210R, 210G, and 210B shown in FIG. 2 are regularly arrayed in the x direction, and an object image acquired from each of the first sub-pixels of a pixel A group including these pixels A is defined as image A. Similarly, the pixels B 220R, 220G, and 220B shown in FIG. 2 are regularly arrayed in the x direction, and an object image acquired from each of the first sub-pixels of a pixel B group including these pixels B is defined as image B. By detecting the relative position (the amount of image shift) between images A and B, the amount of focus shift (the amount of defocus) of an object image having a luminance distribution in the x direction can be detected.

The pixels A' 230R, 230G, and 230B shown in FIG. 2 are regularly arrayed in the y direction, and an object image acquired from each of the first sub-pixels of a pixel A' group including these pixels A' is defined as image A'. Similarly, the pixels B' 240R, 240G, and 240B shown in FIG. 2 are regularly arrayed in the y direction, and an object image acquired from each of the first sub-pixels of a pixel B' group including these pixels B' is defined as image B'. By detecting the relative position (the amount of image shift) between images A' and B', the amount of focus shift (the amount of defocus) of an object image having a luminance distribution in the y direction can be detected. This can be done using a structure, in which the center of gravity position of the light-receiving surface defining the first semiconductor layer is different from that of the light-receiving surface defining both the first semiconductor layer and the second semiconductor layer.

At the same time, an image capture signal can be obtained from the second sub-pixel of each pixel. This can be done using a structure, in which the first semiconductor layer is included in the second semiconductor layer, the second semiconductor layer is included in the third semiconductor layer, the first semiconductor layer and second semiconductor layer have different polarities, and the first semiconductor layer and third semiconductor layer have an equal polarity.

The above-mentioned arrangement makes it possible to arrange focus detection pixels without generating pixels unavailable as image capture pixels, thus attaining both a high-quality image and a focus detection function of the phase difference scheme.

Referring to FIGS. 5A to 5C, as the F-number of the imaging optical system increases, the exit pupil 400 reduces, so only a light beam in the vicinity of the optical axis can pass through it. To allow detection of the amount of defocus even if the F-number is relatively large, the pupil intensity distribution of the first sub-pixel of pixel A and that of the first sub-pixel of pixel B shown in FIG. 8 need to have a sufficiently high light reception intensity in the vicinity of the optical axis. Thus, the center of gravity of the light-receiving surface defining both the first photo-electric conversion unit and the second photo-electric conversion unit is desirably included in the light-receiving surface defining the first photo-electric conversion unit.

Figure 18:
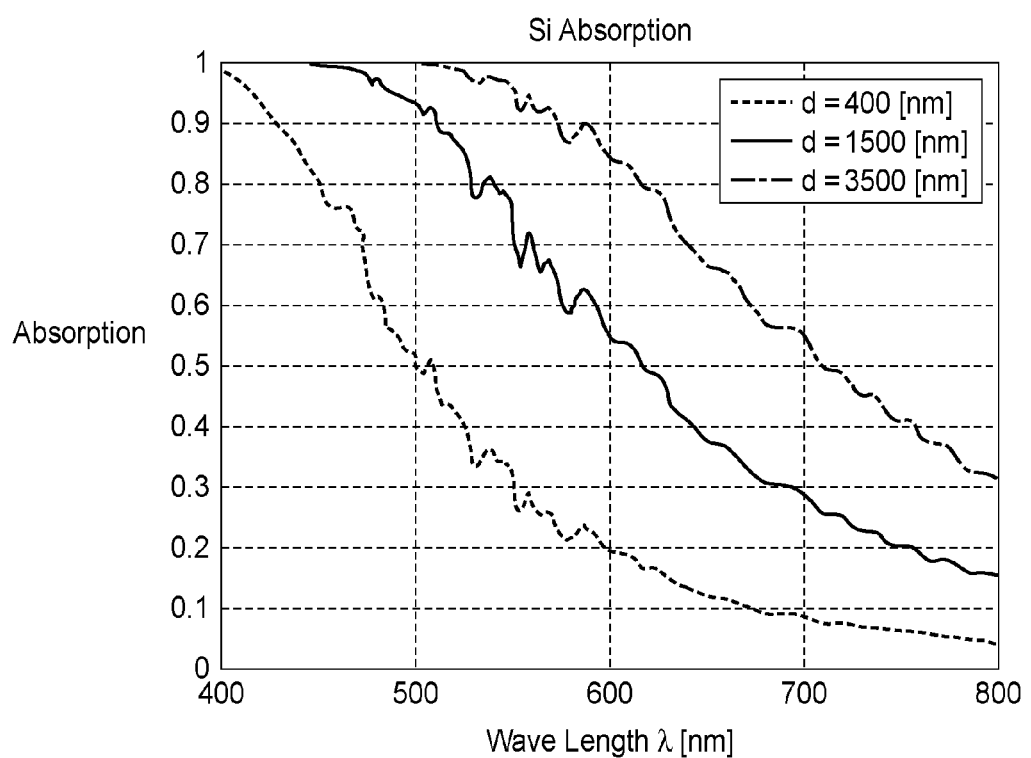
FIG. 18 is a graph showing the spectral absorbance characteristics of silicon.

FIG. 18 shows, using a graph indicated by a broken line, the spectral absorbance when thickness of the Si layer is 400 nm. To receive about 75 percent or more of light having wavelengths of 450 to 470 nm corresponding to B (Blue) by both the first photo-electric conversion unit and second photo-electric conversion unit, the depth of the first semiconductor layer is desirably 400 nm or more. FIG. 18 also shows, using a graph indicated by a solid line, the spectral absorbance when the thickness of the Si layer is 1,500 nm. To receive about 75 percent or more of light having wavelengths of 520 to 540 nm corresponding to G (Green) by both the first photo-electric conversion unit and second photo-electric conversion unit, the depth of the first semiconductor layer is desirably 1,500 nm or more. FIG. 18 moreover shows, using a graph indicated by an alternate long and short dashed line, the spectral absorbance when the thickness of the Si layer is 3,500 nm. To receive 75 percent or more of light having wavelengths of 620 to 640 nm corresponding to R (Red) by both the first photo-electric conversion unit and second photo-electric conversion unit, the depth of the first semiconductor layer is desirably 3,500 nm or more.

Figure 9:
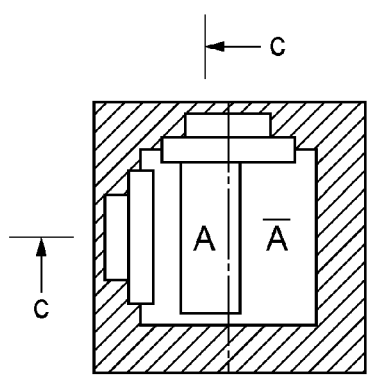
FIG. 9 is a schematic plan view of pixel A in the first embodiment of the present invention.
Figure 10:
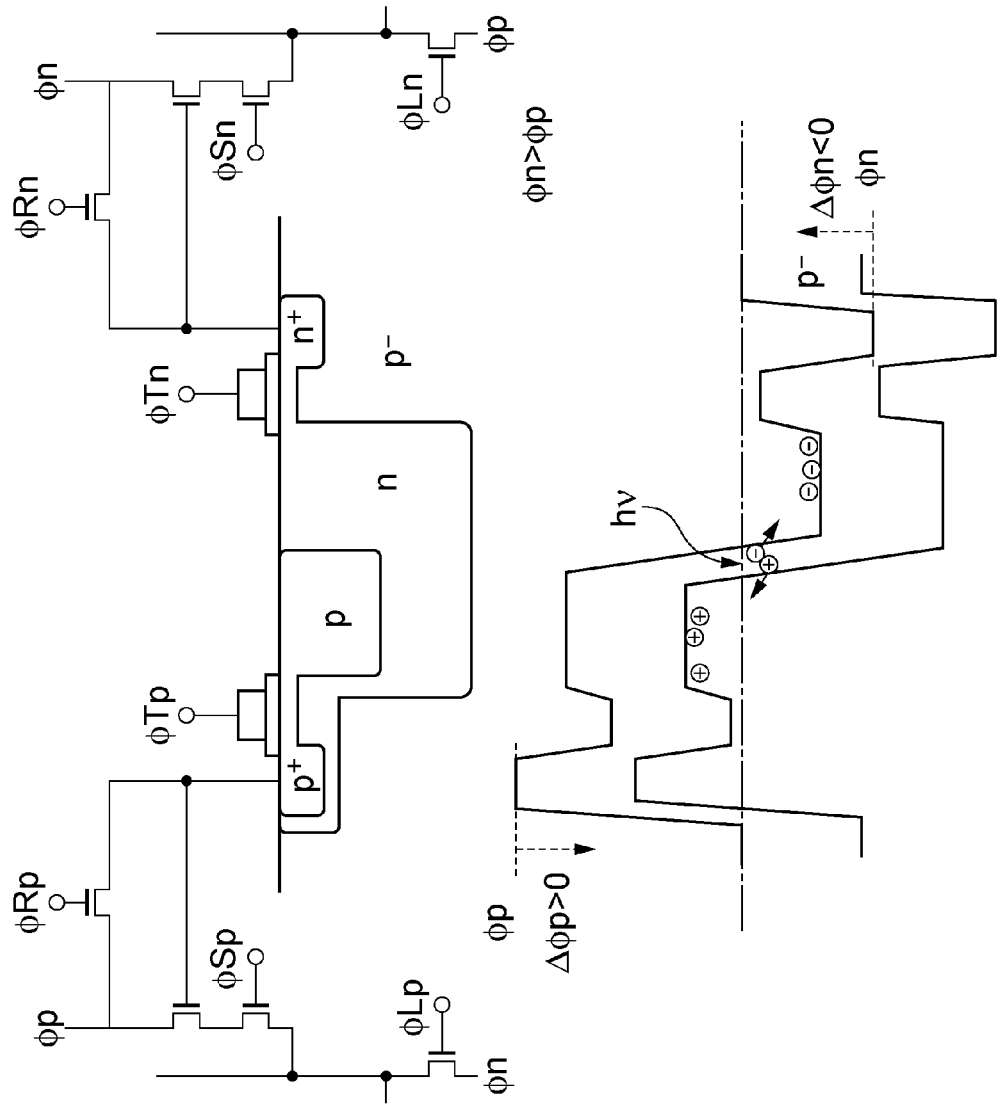
FIG. 10 is a schematic sectional view of pixel A in the first embodiment of the present invention.

FIG. 10 shows a cross-section c-c in the schematic plan view of pixel A in this embodiment shown in FIG. 9. FIG. 10 shows a schematic sectional view of the pixel structure on the upper side, and a schematic view of the energy level on the lower side.

Referring to FIG. 10, reference symbols $\phi p$ and $\phi n$ denote the power supply voltages, and $\phi n > \phi p$. Reference symbol $\phi Tp$ is the transfer gate voltage of the first sub-pixel; $\phi Rp$, the reset gate voltage of the $p^+$ FD of the first sub-pixel; $\phi Sp$, the selection gate voltage of the first sub-pixel; and $\phi Lp$, the line selection gate voltage. Also, reference symbol $\phi Tn$ denotes the transfer gate voltage of the second sub-pixel; $\phi Rn$, the reset gate voltage of the $n^+$ FD of the second sub-pixel; $\phi Sn$, the selection gate voltage of the second sub-pixel; and $\phi Ln$, the line selection gate voltage of the second sub-pixel.

Accumulation operation control of the first sub-pixel in this embodiment will be described below, and the same applies to the second sub-pixel.

First, to reset a photodiode PD1 of the first sub-pixel, the transfer gate voltages $\phi Tp$ and reset gate voltages $\phi Rp$ on all rows are simultaneously turned on. The moment the transfer gate voltages $\phi Tp$ and reset gate voltages $\phi Rp$ are simultaneously turned off, an accumulation operation starts. After accumulation for a desired time, the transfer gate voltages $\phi Tp$ on all rows are turned on and turned off again, thereby transferring signal charges in the first sub-pixels to the $p^+$ FDs of the first sub-pixels at once. Next, the selection gate voltage $\phi Sp$ is turned on/off for each row, thereby sequentially reading the signal charges, transferred to the $p^+$ FDs, for each row. Also, the line selection gate voltage $\phi Ln$ is turned on/off, thereby selecting columns to be read and sequentially reading them.

The transfer gate of the first sub-pixel and that of the second sub-pixel may be connected as needed so that the first sub-pixel and second sub-pixel share a common transfer gate. With this sharing, two transfer gate signal lines can be decreased to one transfer gate signal line, thus more easily reducing the pixel size.

The above-mentioned arrangement makes it possible to arrange focus detection pixels without generating pixels unavailable as image capture pixels, thus attaining both a high-quality image and a focus detection function of the phase difference scheme.

Second Embodiment

Figure 11:
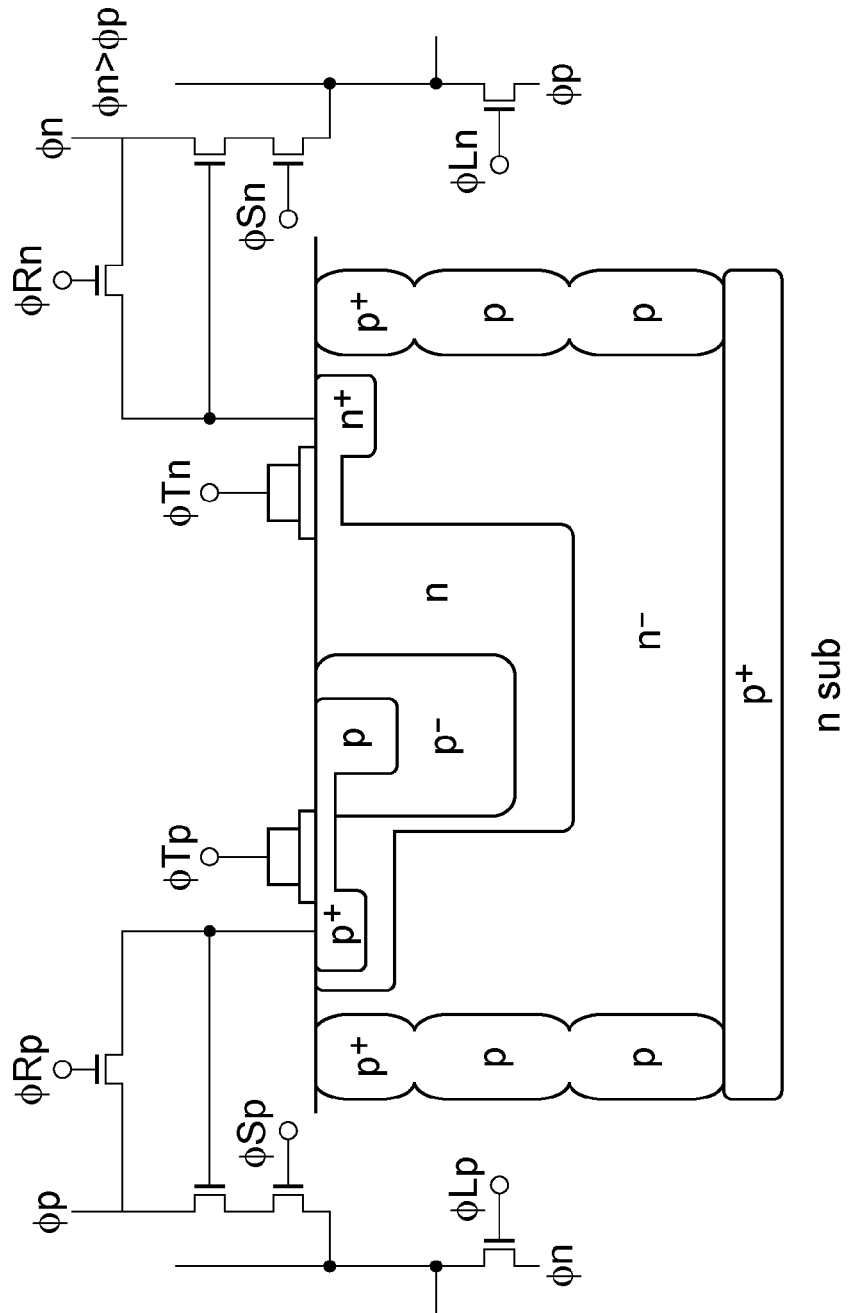
FIG. 11 is a schematic sectional view of pixel A in the second embodiment of the present invention.

FIG. 11 is a schematic sectional view of pixel A in the second embodiment of the present invention. A p-intrinsic layer having a low carrier density may be inserted between a p-type layer (first semiconductor layer) and an n-type layer (second semiconductor layer) to form a photodiode in which a photo-electric conversion unit has a pin structure. Similarly, an n-intrinsic layer may be inserted between an n-type layer (second semiconductor layer) and a $p^+$ buried layer (third semiconductor layer) to form a photodiode in which a photo-electric conversion unit has a pin structure. By forming a photo-electric conversion unit having a pin structure, a depletion layer can be expanded in area, thus improving the light reception sensitivity. Features other than the formation of a photo-electric conversion unit having a pin structure are the same as in the first embodiment.

Third Embodiment

Figure 12:
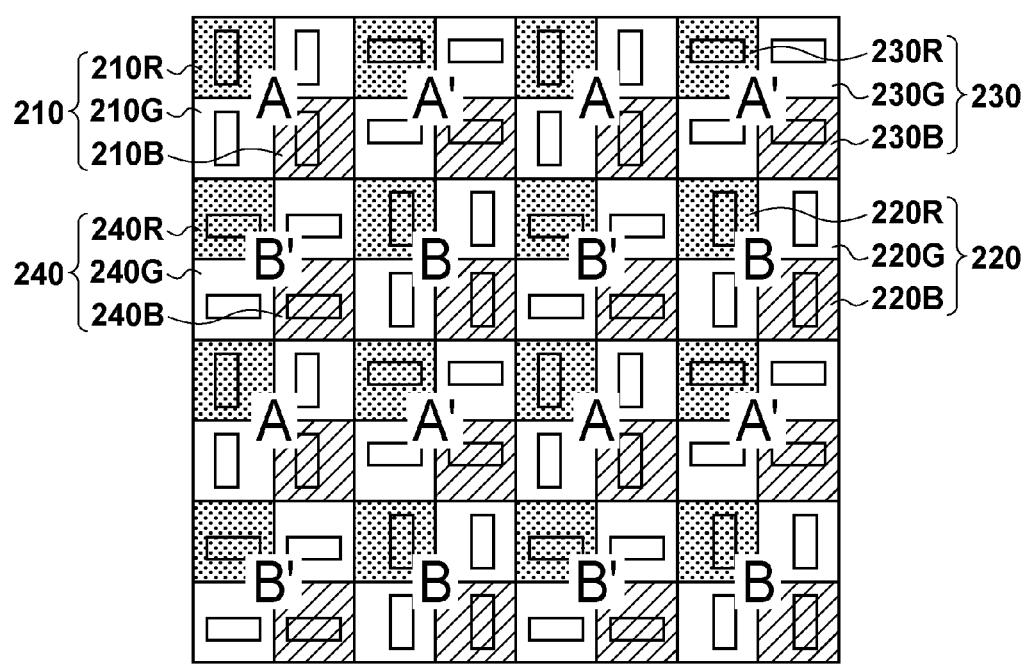
FIG. 12 is a schematic view of a pixel array in the third embodiment of the present invention.

FIG. 12 is a schematic view of a pixel array of an image sensor in the third embodiment of the present invention. In the pixel array shown in FIG. 12, a pixel A group 210, a pixel B group 220, a pixel A' group 230, and a pixel B' group 240 are arrayed in a square pattern. All types of pixels are regularly arrayed at an interval of 4 (rows)×4 (columns) pixels. This facilitates interpolation processing when a signal from each first sub-pixel is acquired not only as a focus detection signal but also as, for example, a parallax signal for a stereoscopic image. Features other than the pixel array are the same as in the first embodiment.

Fourth Embodiment

Figure 13:
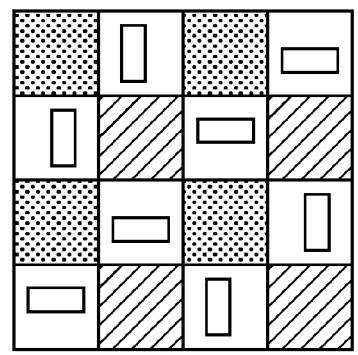
FIG. 13 is a schematic view of a pixel array in the fourth embodiment of the present invention.

FIG. 13 is a schematic view of a pixel array of an image sensor in the fourth embodiment of the present invention. In the pixel array shown in FIG. 13, pixels including first sub-pixels and second sub-pixels, as in the first embodiment, are formed only as G pixels in a Bayer arrangement. By partly forming pixels including first sub-pixels and second sub-pixels on an image sensor to decrease the numbers of signal lines and transistors per pixel, the pixel size can more easily be reduced. Features other than the pixel array are the same as in the first embodiment.

Fifth Embodiment

Figure 14:
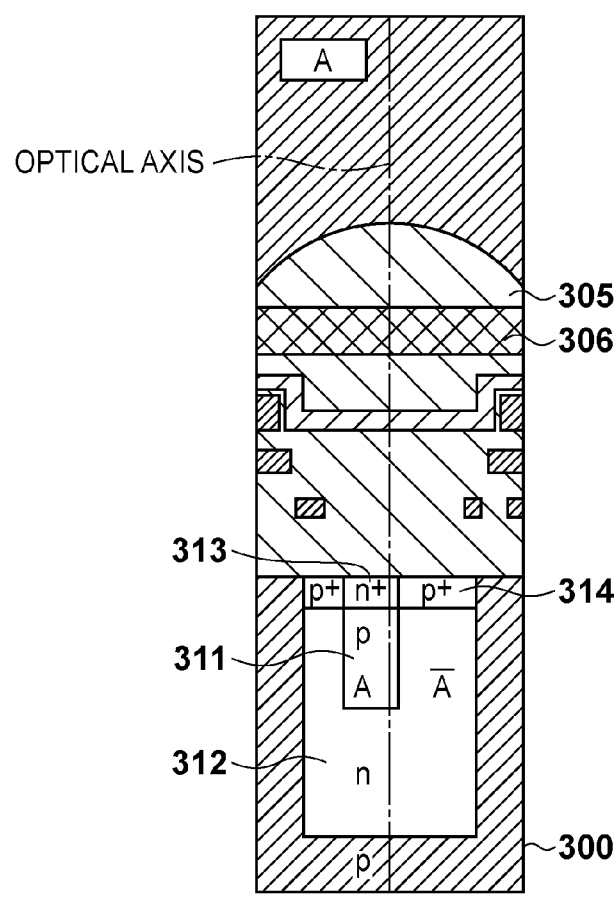
FIG. 14 is a schematic sectional view of pixel A in the fifth embodiment of the present invention.

FIG. 14 is a schematic sectional view of pixel A in the fifth embodiment of the present invention. Referring to FIG. 14, a surface $n^+$ layer 313 and a surface $p^+$ layer 314 are formed above a p-type layer (first semiconductor layer) 311 and an n-type layer (second semiconductor layer) 312 to form a buried photodiode. By forming a buried photodiode, dark current noise expected to be generated depending on the interface level can be suppressed, thus improving the S/N ratio. Features other than the formation of a buried photodiode are the same as in the first embodiment.

Sixth Embodiment

Figure 15:
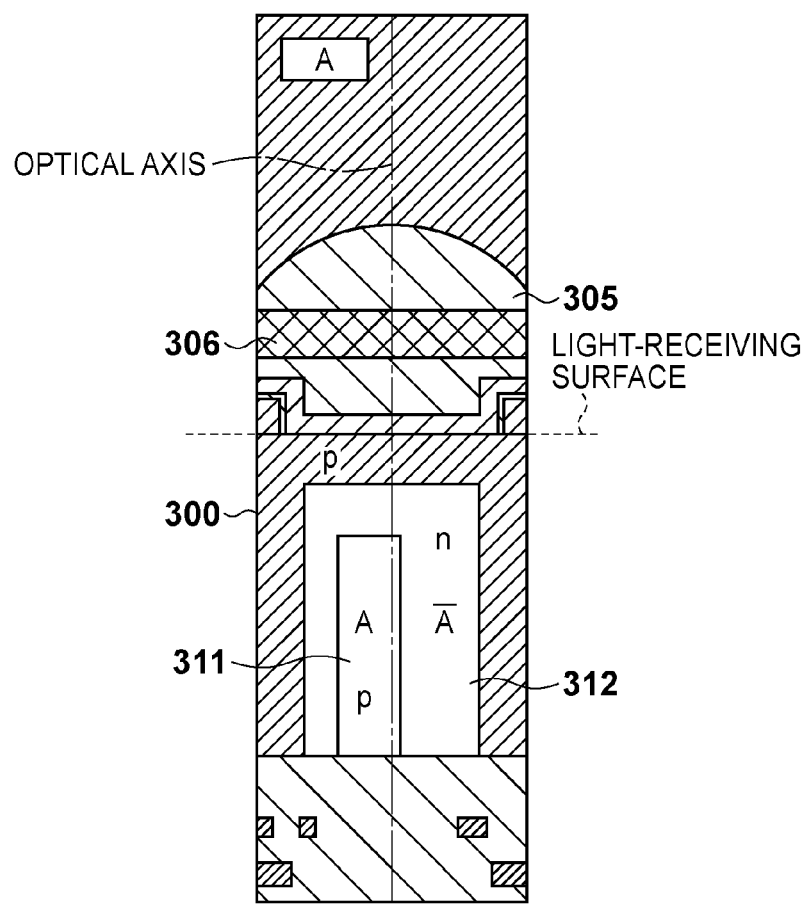
FIG. 15 is a schematic sectional view of pixel A in the sixth embodiment of the present invention.

FIG. 15 is a schematic sectional view of pixel A in the sixth embodiment of the present invention. Referring to FIG. 15, pixels including first sub-pixels and second sub-pixels in the present invention are formed on a back-side illumination image sensor which receives light from the opposite side of an interconnection layer. In the back-side illumination image sensor, "the center of gravity of the light-receiving surface defining a first semiconductor layer" means the center of gravity of a density distribution obtained by perpendicularly projecting the first semiconductor layer onto the light-receiving surface. Also, "the center of gravity of the light-receiving surface defining both a first semiconductor layer and a second semiconductor layer" means the center of gravity of a density distribution obtained by perpendicularly projecting an area including both the first semiconductor layer and the second semiconductor layer onto the light-receiving surface. As mentioned in this embodiment, the back-side illumination image sensor is also configured such that the center of gravity of the light-receiving surface defining the first semiconductor layer is different from that of the light-receiving surface defining both the first semiconductor layer and the second semiconductor layer. Features other than the use of the back-side illumination image sensor are the same as in the first embodiment.

Seventh Embodiment

Figure 16:
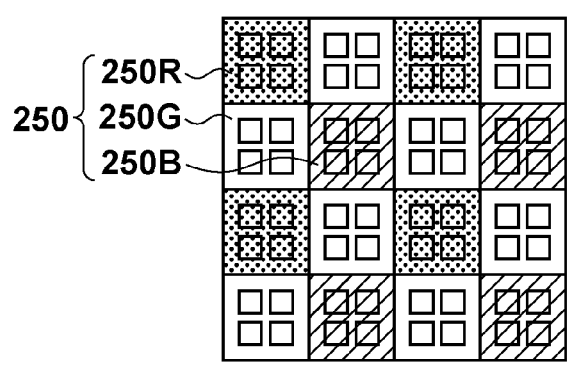
FIG. 16 is a schematic view of a pixel array in the seventh embodiment of the present invention.

FIG. 16 is a schematic view of a pixel array of an image sensor in the seventh embodiment of the present invention. FIG. 16 shows a pixel array of a two-dimensional CMOS sensor (image sensor) in this embodiment in the range of 4 (columns)×4 (rows) pixels. In this embodiment, a pixel group 250 including 2 (rows)×2 (columns) pixels shown in FIG. 16 adopts a Bayer arrangement in which pixels 250G having the spectral sensitivity of G are arranged as two diagonal pixels, and a pixel 250R having the spectral sensitivity of R and a pixel 250B having the spectral sensitivity of B are arranged as the remaining two pixels. Each of the pixels 250R, 250G, and 250B includes four first sub-pixels for a parallax image and one second sub-pixel for image capture.

Figure 17B:
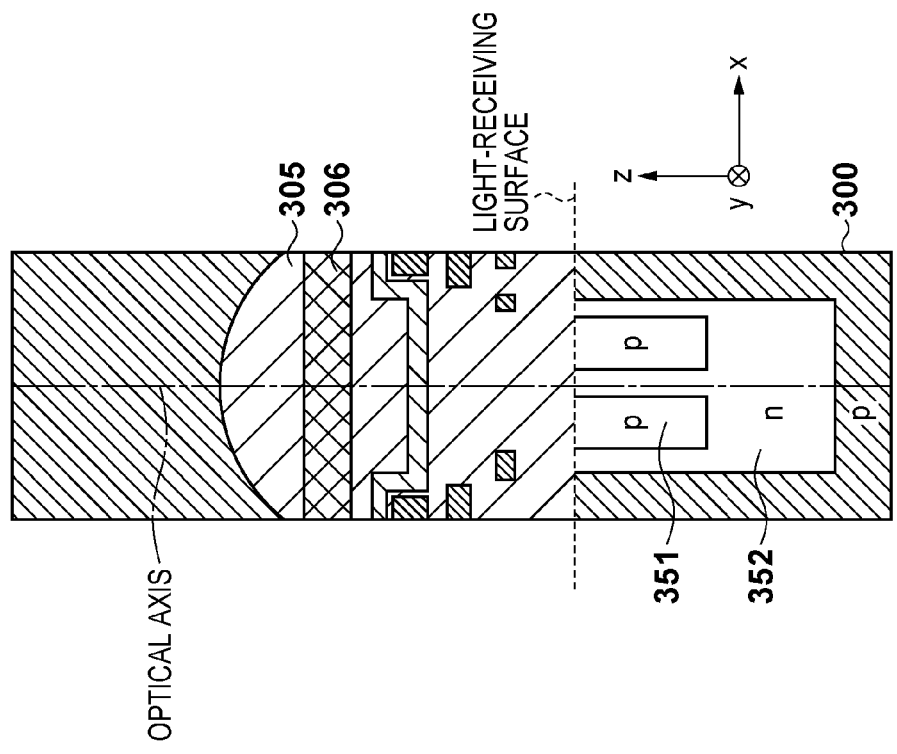
FIGS. 17A and 17B are a schematic plan view and schematic sectional view, respectively, of a pixel in the seventh embodiment of the present invention.
Figure 17A:
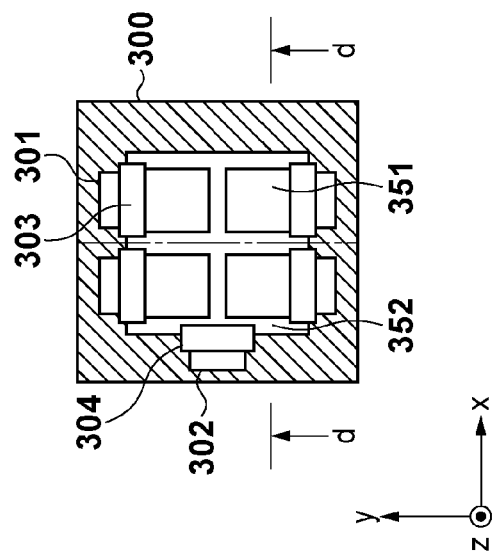

FIG. 17A is a plan view of one pixel 250G of the image sensor, shown in FIG. 16, when viewed from the side of the light-receiving surface of the image sensor (+z side), and FIG. 17B is a sectional view of a cross-section d-d in FIG. 17A when viewed from the −y side.

In the pixel 250G in this embodiment, an n-type layer (second semiconductor layer) 352 is formed to be included in a p-type well (third semiconductor layer) 300, and four p-type layers (first semiconductor layers) 351 are formed to be included in the n-type layer (second semiconductor layer) 352, as shown in FIGS. 17A and 17B. The four p-type layers (first semiconductor layers) 351 shift toward (−x,−y), (x,−y), (x,y), and (−x,y), respectively. More specifically, the p-type layer (first semiconductor layer) 351 is divided into a plurality of partial semiconductor layers, and the center of gravity of the light-receiving surface defining at least one partial semiconductor layer shifts with respect to that of the light-receiving surface defining both the p-type layer (first semiconductor layer) 351 including the plurality of partial semiconductor layers, and one n-type layer (second semiconductor layer) 352. Note that the first semiconductor layer and the second semiconductor layer have different polarities, and the first semiconductor layer and the third semiconductor layer have an equal polarity. Features other than those mentioned above are the same as in the first embodiment. The above-mentioned arrangement makes it possible to acquire a parallax image simultaneously with a captured image.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-200291, filed Sep. 7, 2010, which is hereby incorporated by reference herein in its entirety.

The invention claimed is:

1. An image sensor comprising:
a plurality of pixels, wherein each of the plurality of pixels includes:
   a first semiconductor area, forming a first sub-pixel including an upper surface that is a first light receiving surface that is configured to receive light;
   a second semiconductor area, having a polarity different from a polarity of the first semiconductor area, forming a second sub-pixel including an upper surface that is a second light receiving surface that is configured to receive light; and
   a third semiconductor area, all of the third semiconductor area having a polarity equal to the polarity of the first semiconductor area, arranged between the pixel and an adjacent pixel to separate the pixel and the adjacent pixel; and
a microlens,
wherein the first semiconductor area is included in the second semiconductor area and the second semiconductor area is included in the third semiconductor area, and
wherein a center of gravity position of the first light-receiving surface defining the first semiconductor area is different from a center of gravity position of a light-receiving surface defining a combination of both the first light receiving surface of the first semiconductor area and the second light receiving surface of the second semiconductor area.

2. An image sensor comprising:
a plurality of pixels, wherein each of the plurality of pixels includes:
   a first semiconductor area, forming a first sub-pixel including a first light receiving surface that is configured to receive light;
   a second semiconductor area, having a polarity different from a polarity of the first semiconductor area, forming a second sub-pixel including a second light receiving surface that is configured to receive light; and
   a third semiconductor area, having a polarity equal to the polarity of the first semiconductor area and arranged between the pixel and an adjacent pixel to separate the pixel and the adjacent pixel; and
a microlens,
wherein the first semiconductor area is included in the second semiconductor area and the second semiconductor area is included in the third semiconductor area,
wherein the first semiconductor area is divided into a plurality of partial semiconductor areas, and wherein a center of gravity position of the first light-receiving surface defining the first semiconductor area is different from a center of gravity position of a light-receiving surface defining a combination of both the first light receiving surface of the first semiconductor area and the second light receiving surface of the second semiconductor area.

3. The sensor according to claim 1, wherein the sensor further comprises a color filter positioned on a side of the microlens with respect to both the first semiconductor area and the second semiconductor area.

4. The sensor according to claim 2, wherein the sensor further comprises a color filter positioned on a side of the microlens with respect to both the first semiconductor area and the second semiconductor area.

5. The sensor according to claim 1, wherein the center of gravity position of the light-receiving surface defining the combination of both the first semiconductor area and the second semiconductor area is included in the light-receiving surface defining the first semiconductor area.

6. The sensor according to claim 2, wherein the center of gravity position of the light-receiving surface defining the combination of both the first semiconductor area and the second semiconductor area is included in the light-receiving surface defining the first semiconductor area.

7. The sensor according to claim 3, wherein, in at least two pixels that include color filters of different colors, the first semiconductor area and the second semiconductor area have a same structure.

8. The sensor according to claim 4, wherein, in at least two pixels that include color filters of different colors, the first semiconductor area and the second semiconductor area have a same structure.

9. The sensor according to claim 1, wherein the sensor is incorporated in an image capture apparatus.

10. The sensor according to claim 2, wherein the sensor is incorporated in an image capture apparatus.

* * * * *